US009986351B2

(12) United States Patent
Agarwal et al.

(10) Patent No.: US 9,986,351 B2
(45) Date of Patent: May 29, 2018

(54) DIRECT CURRENT (DC) AND/OR ALTERNATING CURRENT (AC) LOAD DETECTION FOR AUDIO CODEC

(71) Applicant: Cirrus Logic International Semiconductor Ltd., Edinburgh (GB)

(72) Inventors: Shatam Agarwal, Austin, TX (US); Anand Ilango, Austin, TX (US); Alvin C. Storvik, Austin, TX (US); Cory Jay Peterson, Austin, TX (US); Daniel John Allen, Austin, TX (US); Aniruddha Satoskar, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 153 days.

(21) Appl. No.: 15/050,139

(22) Filed: Feb. 22, 2016

(65) Prior Publication Data

US 2017/0245071 A1    Aug. 24, 2017

(51) Int. Cl.
*H04R 29/00* (2006.01)
*H04R 1/10* (2006.01)
(Continued)

(52) U.S. Cl.
CPC ........... *H04R 29/001* (2013.01); *H03F 3/181* (2013.01); *H03M 1/66* (2013.01); *H03F 2200/03* (2013.01); *H03F 2200/222* (2013.01)

(58) Field of Classification Search
CPC .... H04R 1/1016; H04R 1/1041; H04R 5/033; H04R 5/04; H04R 2420/03;
(Continued)

(56) References Cited

U.S. PATENT DOCUMENTS 6,016,445 A * 1/2000 Baura .................. A61N 1/3943
324/607
6,597,183 B1 * 7/2003 Male ...................... G01R 27/02
324/525
(Continued)

FOREIGN PATENT DOCUMENTS

EP           2905974 A1    8/2015
WO      198703378 A1    6/1987
(Continued)

OTHER PUBLICATIONS

Brennan, Sean "Measuring a Loudspeaker Impedance Profile Using the AD5933" Application Note Analog Devices, No. AN-843, Jun. 2007 (Jun. 2007), pp. 1-12.

*Primary Examiner* — Xu Mei
(74) *Attorney, Agent, or Firm* — Norton Rose Fulbright US LLP

(57) ABSTRACT

A portable audio device may be configured to measure load characteristics of headphones. The device may measure direct current (DC) and/or alternating current (AC) characteristics of the load. These characteristics may be measured by an audio component, such as an audio codec chip or integrated circuit (IC) controller, and reported to software or firmware executing on a processor coupled to the audio component. The software or firmware may then take action based on the measured load characteristics. For example, the load characteristics may be compared to a database of headphones and their known load characteristics to determine a particular headphone model or type of headphone attached to the audio output. The processor may then apply an appropriate equalization curve.

34 Claims, 10 Drawing Sheets

(51) Int. Cl.
*H03M 1/66* (2006.01)
*H03F 3/181* (2006.01)

(58) Field of Classification Search
CPC .............. H04R 2420/05; H04R 29/001; H03F 2220/03; H03F 2220/222; H03F 3/181
USPC ....... 381/74, 58, 81, 123; 333/17.3, 32, 124; 324/607; 327/547
See application file for complete search history.

(56) References Cited

U.S. PATENT DOCUMENTS

| | | | | |
|---|---|---|---|---|
| 6,753,732 | B1 * | 6/2004 | Moreland | H03F 3/45089 330/261 |
| 7,057,460 | B2 * | 6/2006 | Kaviani | H03F 3/45188 330/257 |
| 7,579,832 | B1 * | 8/2009 | Blackburn | H04R 3/00 324/300 |
| 7,808,324 | B1 | 10/2010 | Woodford et al. | |
| 7,912,501 | B2 * | 3/2011 | Johnson | H01R 13/703 455/556.1 |
| 9,100,757 | B2 * | 8/2015 | Johnson | H04R 29/001 |
| 9,438,982 | B2 * | 9/2016 | Thandri | H04R 1/1041 |
| 9,479,868 | B2 * | 10/2016 | Ilango | H04R 29/001 |
| 9,712,906 | B1 * | 7/2017 | Agarwal | H04R 1/1041 |
| 2004/0122541 | A1 | 6/2004 | DiSanza et al. | |
| 2008/0155134 | A1 | 6/2008 | Mulligan et al. | |
| 2014/0003616 | A1 | 1/2014 | Johnson et al. | |
| 2014/0010381 | A1 | 1/2014 | Doy | |
| 2015/0071466 | A1 * | 3/2015 | Lasseuguette | H03F 1/3205 381/111 |
| 2015/0231398 | A1 | 8/2015 | Marnfeldt et al. | |

FOREIGN PATENT DOCUMENTS

| | | |
|---|---|---|
| WO | 2009010056 A1 | 1/2009 |
| WO | 2009/134537 A2 | 11/2009 |
| WO | 2015039002 A2 | 3/2015 |

* cited by examiner

DIRECT CURRENT (DC) AND/OR ALTERNATING CURRENT (AC) LOAD DETECTION FOR AUDIO CODEC

FIELD OF THE DISCLOSURE

The instant disclosure relates to load measurements. More specifically, portions of this disclosure relate to detecting characteristics of a load attached to an audio output using direct current (DC) and/or alternating current (AC)-based techniques.

BACKGROUND

Portable audio devices have become extremely popular devices in recent years. Their popularity has soared, in part, as a result of a reduction in electric component power consumption, which makes long battery life possible, and a reduction in cost of digital data storage, which makes carrying large collections of music in a pocket-sized device possible. Further, mobile phones and tablets function as portable audio devices, and mobile phone and tablet ownership has significantly increased as a result in declining prices of smartphones and tablets, and increased availability of 4G technology that allows streaming and downloading of audio files to the smartphones and tablets. Although audio quality from portable audio devices has increased over the time of growth of the portable audio device market, audio quality has generally not been a primary differentiator between devices. However, as other technological improvements, such as storage density and power consumption, are coming at a slower rate, consumers are beginning to evaluate devices based on audio quality. Further, professional and semi-professional musicians and technicians are making more use of portable audio devices in their businesses, which also demand high audio quality.

One popular manner of consuming audio from a portable audio device is headphones. Headphones vary in cost from a few dollars to a few thousand dollars, and the quality of the headphones span a similarly wide divide. The varying characteristics of headphones on the market can cause a portable audio device to sound significantly different depending on what headphones are plugged in to the device. Conventional portable audio devices, such as a smartphone 102 of FIG. 1, detect when a set of headphones is attached. The device uses this indication to determine when to turn off the loudspeaker. However, conventional portable audio devices generally have no other information about what is plugged in to the headphone jack. For example, one set of headphones 104A may have a DC load impedance of 12 ohms, whereas another set of headphones 104B may have a DC load impedance of 50 ohms. The DC load impedance, one characteristic of the headphones 104A and 104B, can affect the sound quality and sound intensity generated by the smartphone 102. However, because the smartphone 102 has no information about such characteristics, the smartphone 102 is unable to compensate for the difference between headphones 104A and 104B.

Shortcomings mentioned here are only representative and are included simply to highlight that a need exists for improved electrical components, particularly for audio devices employed in consumer-level devices, such as mobile phones. Embodiments described herein address certain shortcomings but not necessarily each and every one described here or known in the art.

SUMMARY

A portable audio device, such as a smartphone, may be configured to measure load characteristics of headphones, or another speaker or transducer, attached to an audio output. The device may measure direct current (DC) and/or alternating current (AC) characteristics of the load. These characteristics may be measured by an audio component, such as an audio coder/decoder (codec) chip or integrated circuit (IC) controller, and reported to software or firmware executing on a processor coupled to the audio component. The software or firmware may then take action based on the measured load characteristics. For example, the load characteristics may be compared to a database of headphones and their known load characteristics to determine a particular headphone model or type of headphone attached to the audio output. The processor may then perform modifications to the audio output to adjust for the headphone's particular load characteristics. For example, a certain headphone may be known to have poor frequency response in a particular frequency range, and the processor may compensate by applying an equalization scheme that boosts sound levels in that frequency range. Although certain functionality is described as performed by an audio component or a processor, the functionality may be present in either the audio component or the processor or another component of the portable audio device. For example, the audio component may include a database of known headphones and report the brand of the attached headphone to the processor, rather than report load characteristics.

According to one embodiment, an apparatus may include a first output node configured to couple to a load and output a first portion of a differential signal; a second output node configured to couple to the load and output a second portion of a differential signal; a first current-mode digital-to-analog converter (DAC) coupled to the first output node through a first switch; a second current-mode digital-to-analog converter (DAC) coupled to the second output node through a second switch; a reference node coupled to the second current-mode digital-to-analog converter (DAC) and coupled to a reference resistance, wherein the reference node may be set at a reference voltage by driving a reference current through the second current-mode digital-to-analog converter (DAC) and through the reference resistance; and/or a comparator coupled to the first output node and coupled to the reference node.

In certain embodiments, the load is a transducer for reproducing audio, and wherein the controller is configured to identify the transducer based, at least in part, on the determined DC impedance of the load; the load may be a transducer for reproducing audio, and wherein the controller is configured to identify the transducer based, at least in part, on the determined DC impedance of the load and the determined AC frequency response of the load; and/or the load may be a transducer for reproducing audio, and wherein the controller is configured to identify the transducer based, at least in part, on the determined AC frequency response of the load.

In certain embodiments, the apparatus may also include a controller; the controller may be configured to operate the first current-mode digital-to-analog (DAC) and to operate the second current-mode digital-to-analog (DAC) to generate a direct current (DC) signal at the first output node and the reference node, respectively, and/or to monitor an output of the comparator to determine a DC impedance of the load; the controller may be configured to operate the second current-mode digital-to-analog (DAC) to perform a step ramp of the reference voltage at the reference node; the controller may be configured to operate the second current-mode digital-to-analog (DAC) to perform a binary search for a reference current and corresponding reference voltage at which a voltage across the load is approximately equal to the reference voltage; the controller may be configured: to operate the first current-mode digital-to-analog (DAC) and to operate the second current-mode digital-to-analog (DAC) to generate an alternating current (AC) signal at the first output node and the reference node, respectively, and/or to monitor an output of the comparator to determine an AC frequency response of the load; the controller may be configured to operate the first current-mode digital-to-analog (DAC) to generate an alternating current (AC) signal at the first output node, to operate the second current-mode digital-to-analog (DAC) to generate a direct current (DC) signal at the reference node, and/or to monitor an output of the comparator to determine an AC frequency response of the load; and/or the controller may be configured to operate the second current-mode digital-to-analog (DAC) to repeatedly increase the DC signal according to any method, such as a ramp step or binary search (and optionally during a positive slope), at the reference node to perform a peak detect on the generated alternating current (AC) signal.

According to another embodiment, an apparatus may include a controller configured to couple to an amplifier circuit and determine at least one characteristic of a load coupled to the amplifier, wherein the controller is configured to perform the steps of: applying a first current from a first current-mode digital-to-analog converter (DAC) to a load through a switch; receiving an indication of a first voltage across the load resulting from the application of the first current; applying a second current from a second current-mode digital-to-analog converter (DAC) to a reference load; receiving an indication of a second voltage across the reference load resulting from the application of the second current; and/or comparing a first voltage across the load with a second voltage across the reference load.

In certain embodiments, the controller may be configured to apply a direct current (DC) signal as the first current from the first current-mode digital-to-analog converter (DAC) and to determine a DC impedance of the load; the controller may be further configured to perform steps comprising adjusting the second current from the second current-mode digital-to-analog converter (DAC) to the reference load, wherein the adjustment comprises a step ramp of the second current-mode digital-to-analog converter (DAC); the controller may be further configured to perform steps comprising adjusting the second current from the second current-mode digital-to-analog converter (DAC) to the reference load, wherein the adjustment comprises a portion of a binary search for a current level at which the first voltage and the second voltage are approximately equal; the controller may be configured to determine a DC impedance of a transducer coupled to an audio amplifier and to identify the transducer based, at least in part, on the determined DC impedance of the transducer; the controller may be further configured to apply an alternating current (AC) signal as the first current from the first current-mode digital-to-analog converter (DAC) and to determine an AC frequency response of the load; the load may be a transducer for reproducing audio, and wherein the controller is configured to identify the transducer based, at least in part, on the determined DC impedance of the load and the determined AC frequency response of the load; the controller may be configured to apply an alternating current (AC) signal as the first current from the first current-mode digital-to-analog converter (DAC) and to determine an AC frequency response of the load; the load may be a transducer for reproducing audio, and wherein the controller is configured to identify the transducer based, at least in part, on the determined AC frequency response of the load; the controller may be configured to operate the second current-mode digital-to-analog (DAC) to repeatedly increase the DC signal according to any method, such as a ramp step or binary search (and optionally during a positive slope), at the reference node to perform a peak detect on the generated alternating current (AC) signal.

According to another embodiment, a method may include applying a first current from a first current-mode digital-to-analog converter (DAC) to a load through a switch; receiving an indication of a first voltage across the load resulting from the application of the first current; applying a second current from a second current-mode digital-to-analog converter (DAC) to a reference load; receiving an indication of a second voltage across the reference load resulting from the application of the second current; and/or comparing a first voltage across the load with a second voltage across the reference load.

In some embodiments, the method may further include adjusting the second current from the second current-mode digital-to-analog converter (DAC) to the reference load, wherein the adjustment comprises a step ramp of the second current-mode digital-to-analog converter (DAC); adjusting the second current from the second current-mode digital-to-analog converter (DAC) to the reference load, wherein the adjustment comprises a portion of a binary search for a current level at which the first voltage and the second voltage are approximately equal; determining a DC impedance of a transducer coupled to an audio amplifier; identifying the transducer based, at least in part, on the determined DC impedance of the transducer; applying a third current comprising alternating current (AC) from the first current-mode digital-to-analog converter (DAC); determining an AC frequency response of the load; and/or operating the second current-mode digital-to-analog (DAC) to repeatedly increase the DC signal according to any method, such as a ramp step or binary search (and optionally during a positive slope), at the reference node to perform a peak detect on the generated alternating current (AC) signal.

In certain embodiments, the step of applying the first current may include applying a direct current (DC) signal, and wherein the method further comprises a step of determining a DC impedance of the load based on the step of comparing the first voltage with the second voltage; and/or the step of applying the first current comprises applying an alternating current (AC) signal, and wherein the method further comprises a step of determining an AC frequency response of the load based on the step of comparing the first voltage with the second voltage.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

Figure 1:
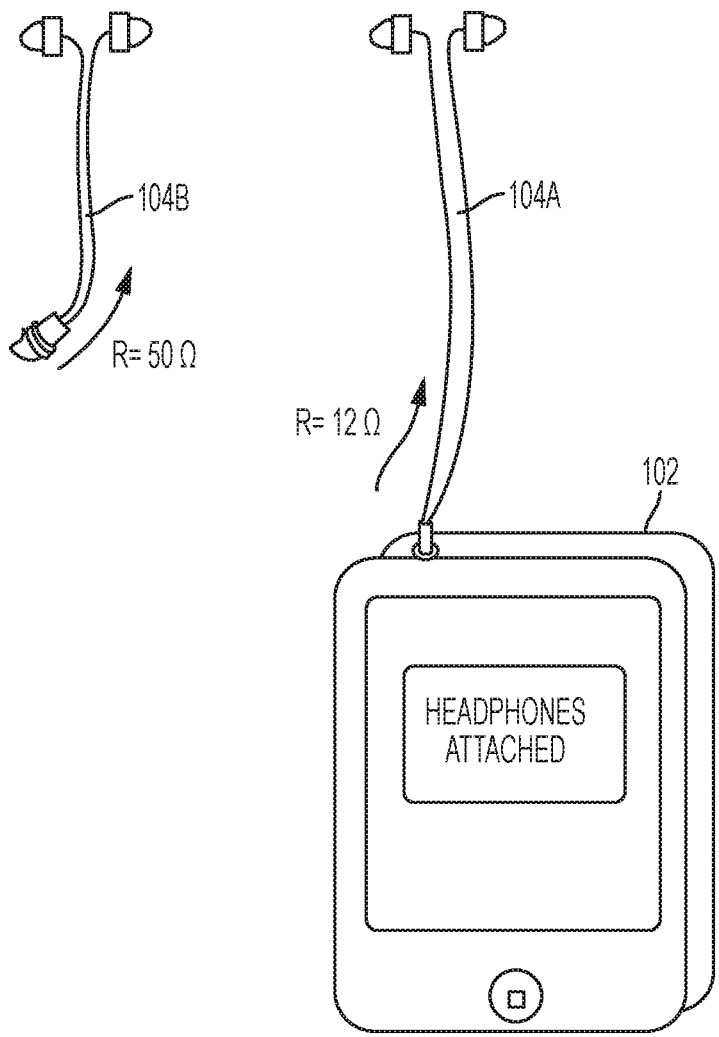
FIG. 1 is a drawing illustrating a conventional smartphone detecting when headphones are attached to an audio output according to the prior art.
Figure 2:
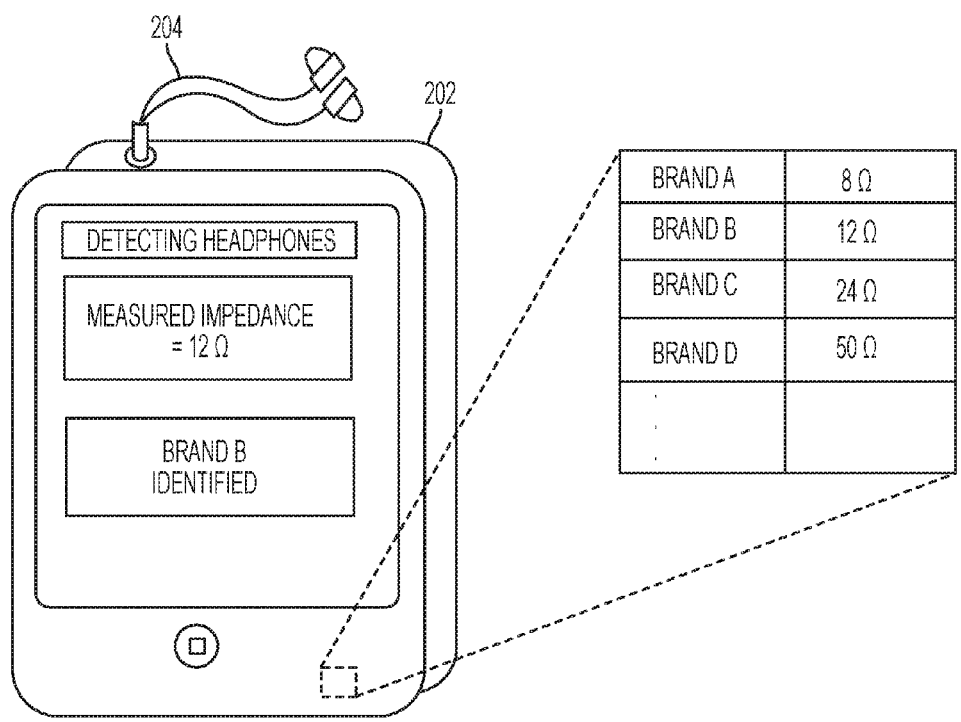
FIG. 2 is a drawing illustrating an example portable audio device detecting load characteristics of headphones attached to an audio output according to one embodiment of the disclosure.

FIG. 2 is a drawing illustrating an example portable audio device detecting load characteristics of headphones attached to an audio output according to one embodiment of the disclosure. A portable audio device 202, such as a smartphone or MP3 player, may include an application processor, memory, a display, and one or more audio components. The audio components may include an audio codec, a digital signal processor (DSP), an analog-to-digital converter (ADC), a digital-to-analog converter (DAC), and/or an amplifier. When a set of headphones 204 is attached to the device 202, the device 202 may detect the connection through an audio plug and determine that headphones, or another transducer or speaker, have been attached. This detection may trigger the device 202, such as through an audio component or the application processor, to determine characteristics of the attached headphones 204. For example, the audio component may perform measurements to determine direct current (DC) or alternating current (AC) load characteristics of the attached headphones 204. In one embodiment, the measurements include a DC impedance, which may be 12 ohms for the headphones 204. This measurement, along with additional information or measurements, may be provided from the audio component to the application processor. The application processor may then compare the measured characteristics to known databases, either stored locally or retrieved from a network location, to identify with particularity the brand, model, or other information regarding the attached headphones 204. In the example of a 12 ohm DC impedance described above, the device 202 may identify the headphones 204 as "Brand B" headphones. The device 202 may then take further action based on the determination regarding the headphones 204. For example, the device 202 may apply equalization levels specifically chosen to improve the sound quality from audio playback through the headphones 204. As another example, the device 202 may adapt audio post-processing for specific original equipment manufacturer (OEM)-bundled and third-party headphones, headsets, Bluetooth™ speakers, and home and auto audio systems.

One or more measurements of the attached headphones 204 may be performed by a variety of circuitry. For example, a load impedance of the headphones may be measured by circuitry configured to detect an impedance. That circuitry may be coupled to an audio output port of the device 202, such as a headphone plug. In one embodiment, that circuitry may be based on a digital-to-analog converter (DAC) present in an audio codec or other integrated circuit (IC) controller contained in the device 202. One circuit for performing load impedance measurements using current-mode DACs is shown in FIG. 3.

Figure 3:
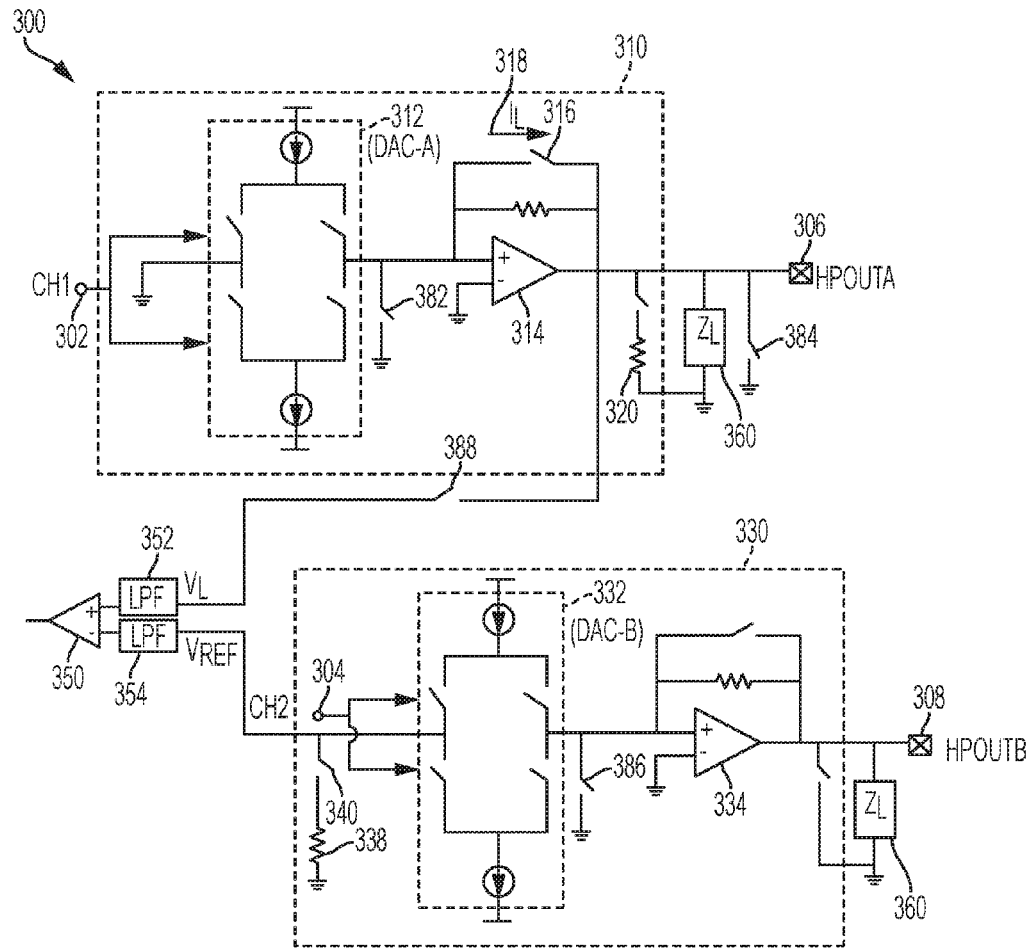
FIG. 3 is an example circuit illustrating a digital-to-analog converter (DAC)-based measurement of load characteristics of headphones according to one embodiment of the disclosure.

FIG. 3 is an example circuit illustrating a digital-to-analog converter (DAC)-based measurement of load characteristics of headphones according to one embodiment of the disclosure. A circuit 300 includes a first path 310 configured to pass current through an attached load 360, such as headphones attached to the headphone plug. The circuit 300 also includes a second path 330 configured to pass current through a reference component. The output of the first path 310 and the second path 330 is provided to an amplifier 350. The amplifier 350 may be configured to compare the output from the first path 310, $V_L$, and the output from the second path 330, $V_{REF}$, and generate a signal based on the comparison. That comparison signal may be provided to other circuitry that controls the first path 310 and second path 330 to continue or terminate measurement of the load impedance and to determine characteristics of the load 360. Low pass filters (LPFs) may be coupled between the amplifier 350 and the output of paths 310 and 330 to reduce noise in the signals arriving at the amplifier 350. A switch 388 may disconnect the first path 310 from the comparator 350.

Each of the paths 310 and 330 may be based, in part, on current-mode DACs. Path 310 includes DAC-A 312, and path 330 includes DAC-B 332. Switches 382 and 386 may be coupled to DAC-A 312 and DAC-B 332, respectively, to ground the output of the switches 382 and 386. DAC-A 312 is configured to receive control signal CH1 at node 302 and generate a current that is output to the load 360, $Z_L$. The input of node 302 may be produced by a delta-sigma modulator. A resistor 320 may be coupled in parallel with the load 360 to provide a defined resistance and prevent the load voltage $V_L$ from rising towards infinity, such as would happen when load 360 has a large resistance. The resistor 320 could thus prevent unintentional popping or clicking noises audible from the headphones when the headphone impedance value is large. A switch 384 may also be coupled to output node 306 to ground the output node 306. During normal operation, current from DAC-A 312 may flow through amplifier 314 to an output node 306, such as a headphone port, to drive audio signals to a transducer of load 360. During measurements, the mute switch 316 may be closed to pass current 318 $I_L$ from the DAC-A 312 to the load 360 without passing through the amplifier 314. Current driven through the load 360 generates a voltage, $V_L$, that may be input to the amplifier 350 and used as part of a measurement of the load 360, $Z_L$. DAC-B 332 is configured to receive a control signal CH2 at input node 304 and generate a current that is output to the reference resistor 338. The input at node 304 may be received from a delta-sigma modulator. During normal operation, current from DAC-B 332 may flow through the amplifier 334 to output node 308, such as a headphone port, to drive audio signals to a transducer of the load 360. The output nodes 306 and 308 may thus produce a differential signal for driving a transducer. During measurements, switch 340 may close to couple reference resistor 338 to the DAC-B 332. Current driven across the resistor 338 generates a reference voltage, $V_{REF}$, that may be input to the amplifier 350 and used as part of a measurement of the load 360, $Z_L$.

The circuit 300 illustrates measurement of the load 360 through the first output node 306, HPOUTA, using the first path 310, while using circuitry of the second path 330 as a reference signal. The operation of the first path 310 and the second path 330 may also be reversed, such that the measurement of the load 360 is performed through the second output node 308, HPOUTB.

Figure 4:
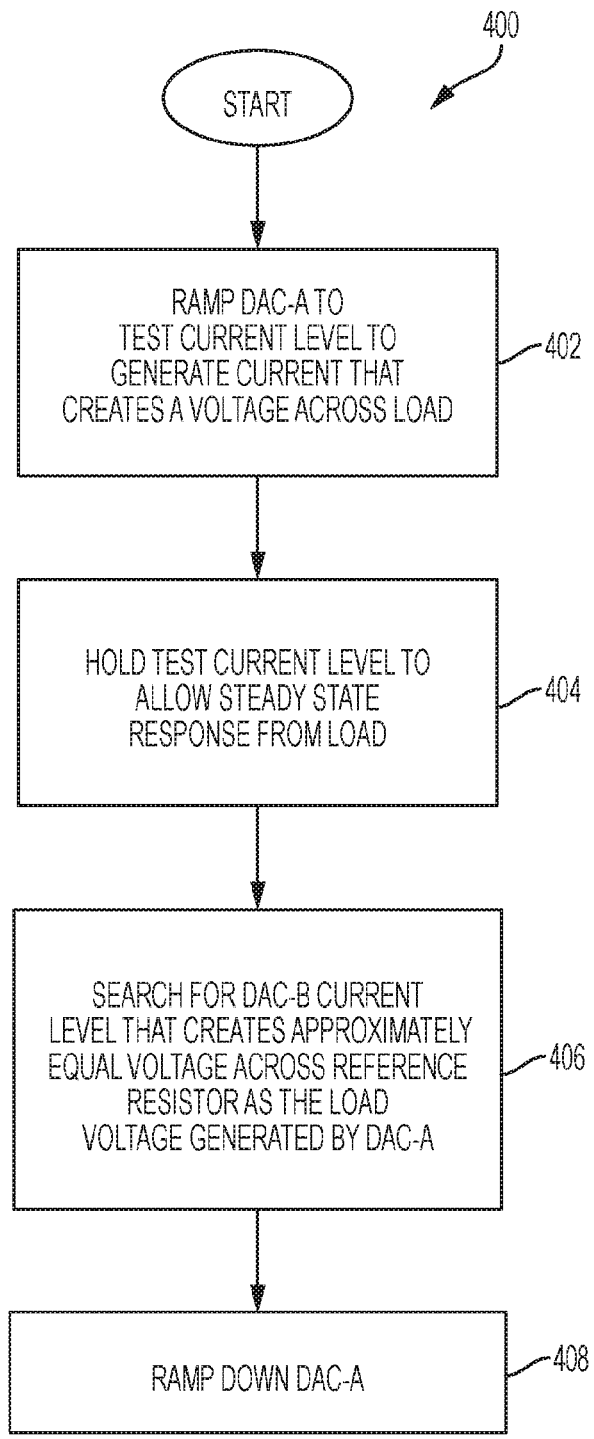
FIG. 4 is an example flow chart illustrating a method of measuring direct current (DC) load characteristics of headphones according to one embodiment of the disclosure.

The operation of the circuit 300 of FIG. 3, such as control of the DAC-A 312 and DAC-B 332 and monitoring the signal at the output of the amplifier 350, may be performed by a controller (not shown). The controller may be integrated into an audio component, such as an audio codec. One method of operating the circuit 300 to measure a characteristic of the load is shown in FIG. 4, which may be executed by the controller. In particular, FIG. 4 illustrates a method of measuring direct current (DC) load characteristics of the load 360, $Z_L$. However, the controller may measure DC load characteristics and/or other load characteristics through the illustrated method or other methods.

FIG. 4 is an example flow chart illustrating a method of measuring direct current (DC) load characteristics of headphones according to one embodiment of the disclosure. A method 400 begins at block 402 with ramping the DAC-A 312 to a test current level to generate current that creates a voltage $V_L$ across the load 360. The test current level may be, for example, a current level approximately half way between zero and full scale of the DAC-A 312. The ramp-up may be at a rate slow enough to not generate audible noise from the headphones. Then, at block 404, the test current level may be held by the DAC-A 312 to allow for development of a steady-state response from the load 360. The hold period of block 404 may be a preprogrammed delay value, such as 200 milliseconds, or the circuit 300 may be monitored to determine when steady-state conditions are reached. Next, at block 406, the DAC-B 332 is controlled to generate a current through the reference resistor 338 that results in a reference voltage, $V_{REF}$, that may be compared to the load voltage, $V_L$, by amplifier 350. DAC-B 332 may be controlled to vary the current through resistor 338 until a reference voltage $V_{REF}$ is approximately equal to and greater than the load voltage $V_L$, which causes the amplifier 350 to toggle output signal from low to high or high to low. This change in output signal may be detected to determine that the load voltage $V_L$ has been determined. After block 406 completes, the final current value may be referred to as $I_{REF}$, and that value used to compute the impedance of the load 360 ZL by the following equation:

$$Z_L = \frac{R_{REF}}{\frac{I_L}{I_{REF}} - 1}$$

where $R_{REF}$ is the resistance of resistor 320, and $I_L$ is the current applied by DAC-A 312. The manner of varying the current through DAC-B 332 may be performed according to any algorithm, including a step ramp (such as a ramp or a coarse/fine search ramp), a binary search, or other search techniques. After the load voltage $V_L$ has been determined, the method 400 continues to block 408 to ramp down the DAC-A 312 current. The determined $V_L$ voltage level may then be used to determine information regarding the load, such as a DC impedance value, a headphone brand, or headphone model. For example, the determined $V_L$ voltage level may be used to determine a DC impedance of the load by dividing the $V_L$ voltage level by a current produced by DAC-A 312 or some other value. In particular, the $V_L$ voltage level is correlated with the DC impedance of the load $Z_L$ by the following equation:

$$V_L = I_L \frac{R_{REF} Z_L}{R_{REF} + Z_L}$$

Figure 5:
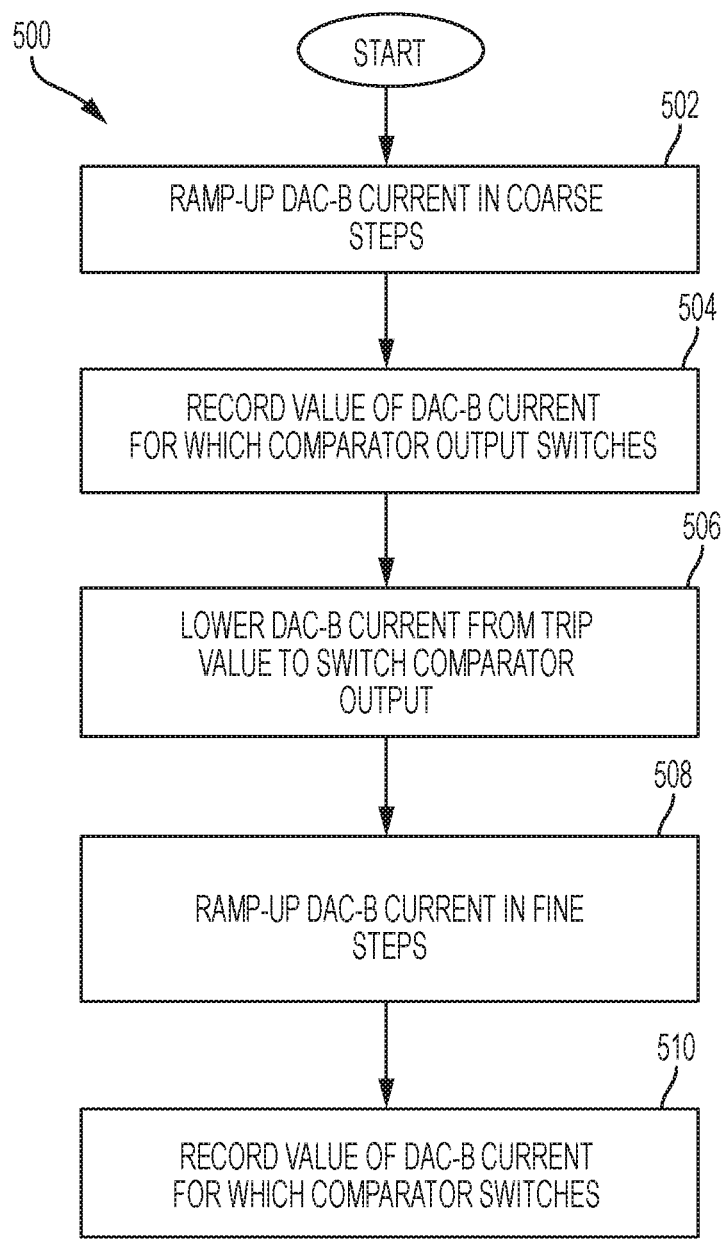
FIG. 5 is an example flow chart illustrating a method of measuring direct current (DC) load characteristics of headphones with a coarse and fine stepping according to one embodiment of the disclosure.

As described above, one example control method for varying the DAC-B 332 current is a coarse/fine search algorithm. One example of a coarse/fine search algorithm is shown in FIG. 5. FIG. 5 is an example flow chart illustrating a method of measuring direct current (DC) load characteristics of headphones with a coarse and fine stepping according to one embodiment of the disclosure. A method 500 begins at block 502 with ramping up the DAC-B 332 current in coarse steps. The ramp may be conducted at a rate of half a clock cycle of the comparator 350 or in continuous-time. The ramp-up of block 502 continues until the comparator 350 output switches. Then, the value of the DAC-B 332 current is recorded at block 504. This recorded value may provide a coarse estimate of the load impedance, which can be calculated from the following equation:

$$Z_{L,coarse} = \frac{R_{REF}}{\frac{I_L}{I_{REF,coarse}} - 1}$$

where $R_{REF}$ is the resistance of resistor 320, $I_L$ is the current applied by DAC-A 312, and $I_{REF,coarse}$ is the value recorded at block 504. Next, at block 506, the DAC-B 332 current is reduced from the value recorded at block 504 to switch the comparator output back to the last state. Then, at block 508, the DAC-B 332 current is again ramped up but in smaller steps than that of the ramp-up of block 502. The fine ramp-up of block 508 is continued until the amplifier 350 output switches. Next, at block 510, the DAC-B 332 current is recorded at block 510. This recorded value may provide a finer estimate of the load impedance, which can be calculated from the following equation:

$$Z_{L,fine} = \frac{R_{REF}}{\frac{I_L}{I_{REF,fine}} - 1}$$

where $R_{REF}$ is the resistance of resistor 320, $I_L$ is the current applied by DAC-A 312, and $I_{REF,fine}$ is the value recorded at block 510. The coarse/fine search algorithm of FIG. 5 may reduce the time consumed in determining the load voltage $V_L$. The coarse search of blocks 502 and 504 allow for a quick determination of load voltage $V_L$, and the fine search of blocks 508 and 510 allow for a high precision measurement in a small range of possible load voltage $V_L$ values.

Figure 6:
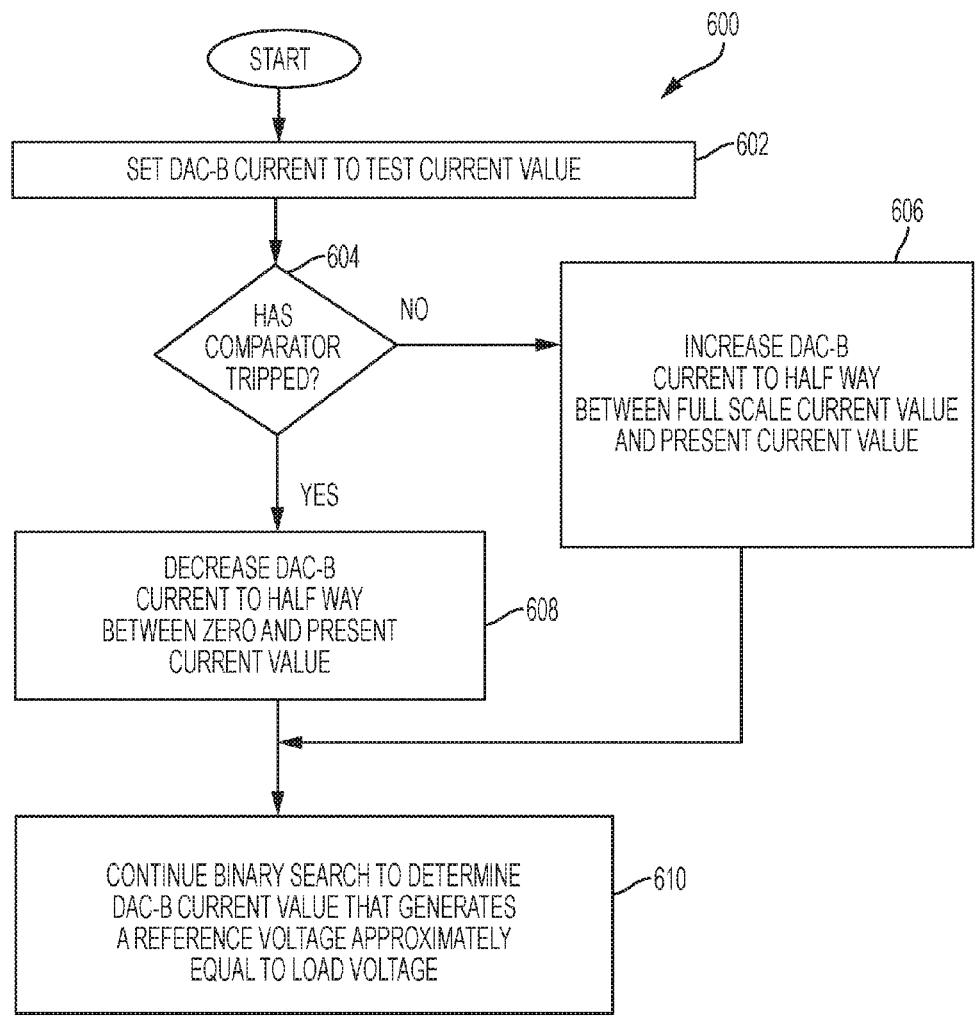
FIG. 6 is an example flow chart illustrating a method of measuring direct current (DC) load characteristics of headphones with a binary search according to one embodiment of the disclosure.

Another example control method for varying the DAC-B 332 current is a binary search algorithm. A binary search algorithm generally operates by splitting a possible range for the load voltage $V_L$ value into two pieces, testing the midpoint between the two pieces, determining whether the actual load voltage $V_L$ value is higher or smaller than the midpoint, and then taking either of the top half or bottom half and again splitting into two pieces and testing the midpoint. This process continues until the approximate load voltage $V_L$ is determined with a desired level of precision. One example of a binary search algorithm is shown in FIG. 6. FIG. 6 is an example flow chart illustrating a method of measuring direct current (DC) load characteristics of headphones with a binary search according to one embodiment of the disclosure. A method 600 begins at block 602 with setting the DAC-B 332 current to a test current value, such as half scale value. Then, at block 604, it is determined if the amplifier 350 output changes. If not, then the actual load voltage $V_L$ value is higher than the test current value. The method 600 thus continues to block 606 to increase the DAC-B 332 current to half way between the full scale current value and the present (test current) current value. If the amplifier 350 output changes at block 604, then the actual load voltage $V_L$ value is lower than the test current value. The method 600 thus continues to block 608 to decrease the DAC-B 332 current to half way between zero and the present (test current) current value. At block 610, the binary search algorithm continues as in blocks 604, 606, and 608 until a DAC-B 332 current value is determined to generate a reference voltage $V_{REF}$ approximately equal to the load voltage $V_L$.

Figure 7:
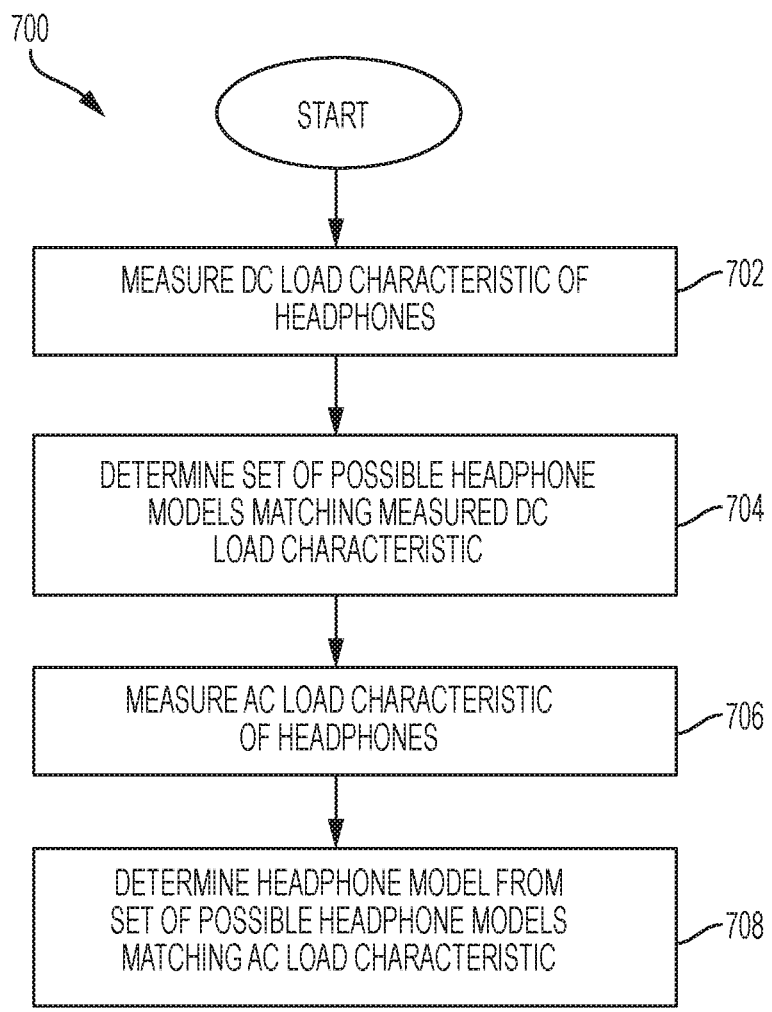
FIG. 7 is an example flow chart illustrating a method of determining a headphone model based on direct current (DC) and/or alternating current (AC) load characteristics of the headphones according to one embodiment of the disclosure.

The techniques for load characterization described above with reference to FIG. 4, FIG. 5, and FIG. 6 may generally be executed to determine a DC load impedance value for the load 360, $Z_L$. AC load impedance characteristics may also be measured using the circuit 300, and the results of the DC and AC characteristics combined to improve precision in identifying the load. One identification method using both DC and AC characteristics is illustrated in FIG. 7. FIG. 7 is an example flow chart illustrating a method of determining a headphone model based on direct current (DC) and/or alternating current (AC) load characteristics of the headphones according to one embodiment of the disclosure. A method 700 begins at block 702 with measuring DC load characteristics of the headphones. Block 702 may include executing one or more of the methods described in FIG. 4, FIG. 5, and/or FIG. 6. Then, at block 704, a set of possible headphone models is determined that match the measured DC load characteristic of block 702. When more than one possible headphone models match the measured characteristics of the connected headphones, further characterization of the headphones may be useful in more particularly identifying the headphones. Thus, at block 706, AC load characteristics of the headphones are measured. Block 706 may include multiple AC measurements at different frequencies. In one embodiment, block 706 may continue performing AC measurements until a model of headphone may be determined with sufficient accuracy. Then, at block 708, the set of possible headphone models may be reduced based on the measured AC characteristics of block 706. This may result in reducing the set down to one possible match for headphones. The mobile audio device may then take action based on the determined headphone model at block 708.

Figure 8:
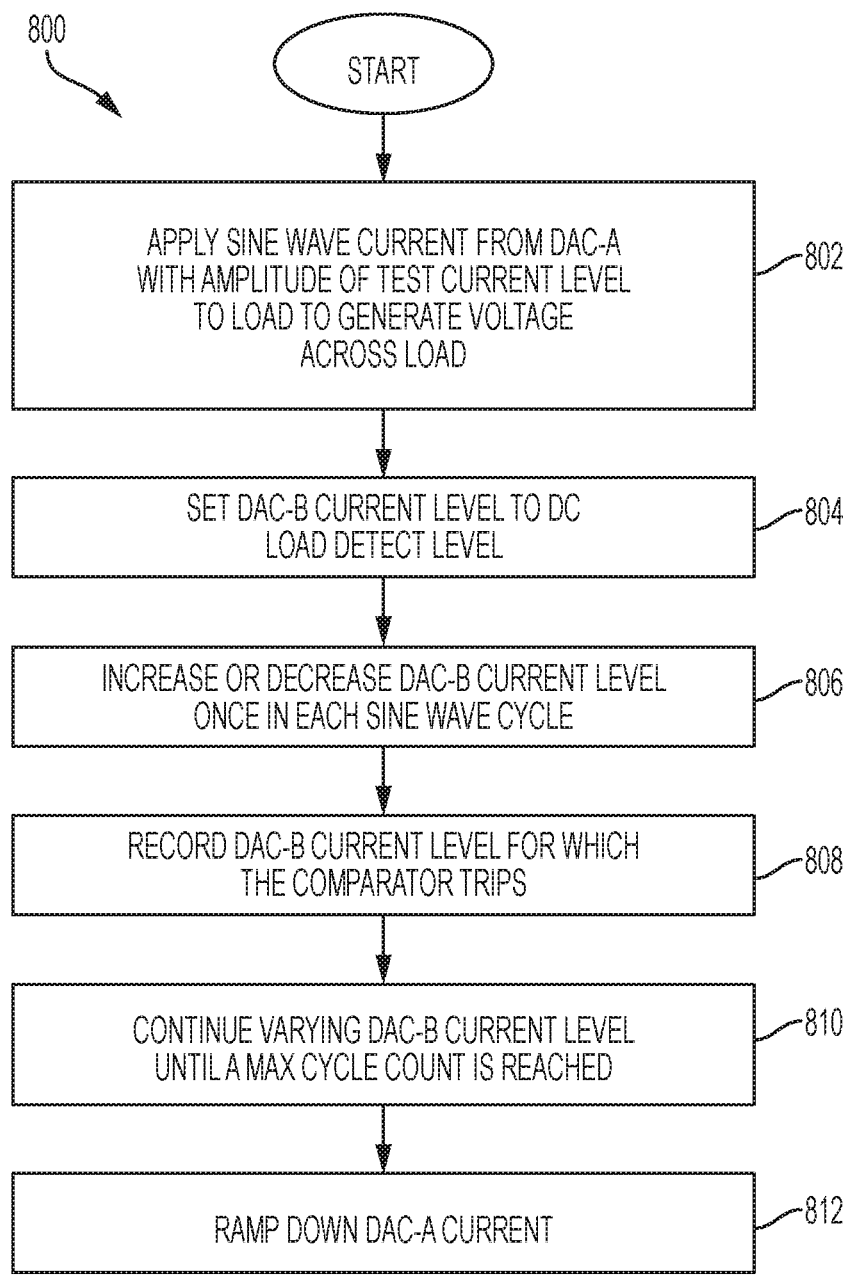
FIG. 8 is an example flow chart illustrating a method of measuring alternating current (AC) load characteristics of headphones according to one embodiment of the disclosure.

FIG. 8 is an example flow chart illustrating a method of measuring alternating current (AC) load characteristics of headphones according to one embodiment of the disclosure. The AC load characteristic measurement of method 800 may be performed similarly to that of the DC load characteristic measurement of block 702, except by controlling DAC-A 312 to apply an alternating current (AC) signal to the load 360. The method 800 begins at block 802 with applying a sine wave current source from DAC-A 312 to the load with an amplitude of a test current level to generate a voltage across the load. This test current level, applied as current IL to load 360, may generate a voltage across the load 360 calculated by the following equation:

$$V_L = I_L \frac{R_{REF} Z_{L,AC}}{R_{REF} + Z_{L,AC}}$$

At block 804, the DAC-B 332 is set to a predetermined value, such as the DC load detect value measured by the method of FIG. 4, FIG. 5, or FIG. 6. An amplitude of the DC signal generated by the DAC-B 332 may be varied to generate different current levels. Next, at block 806, the DAC-B 332 current is increased or decreased once in each sine wave cycle. At block 808, the DAC-B 332 current level that causes the amplifier 350 output to change is recorded as the AC impedance value. The recorded current level, $I_{REF,AC}$ may be used to calculate the load 360 impedance according to the following equation:

$$Z_{L,AC} = \frac{R_{REF}}{\frac{I_L}{I_{REF,AC}} - 1}$$

where $R_{REF}$ is the resistance of resistor 320 and $I_L$ is the current applied by DAC-A 312. At block 810, the DAC-B 332 current is varied until a maximum cycle count is reached. At block 812, the DAC-A 312 current is ramped down. The method of FIG. 8 may be repeated for different frequency sine waves generated by the DAC-A 312 and the DAC-B 332. Thus, for example, a frequency response profile of the microphone may be recorded.

The varying of DAC-B current levels at block 810 may include, for example, executing a binary search algorithm, a peak detection algorithm, or another control technique. A binary search technique in AC detection may consume up to about nine cycles to reach to the final value (within the desired error margin). However, nine cycles is a significant amount of delay at low frequencies. To reduce delay time, a digital peak detect may be performed, in which the DAC-B current is ramped up along a positive slope of the sine wave until the amplifier 350 output switches. Thus, instead of causing the reference voltage $V_{REF}$ to change only once per cycle as with a binary search, the reference voltage $V_{REF}$ may be increased multiple times or continuously during the sine wave to reach the peak. For low frequencies, this digital peak detect technique may reduce delay to four or five cycles.

Figure 9:
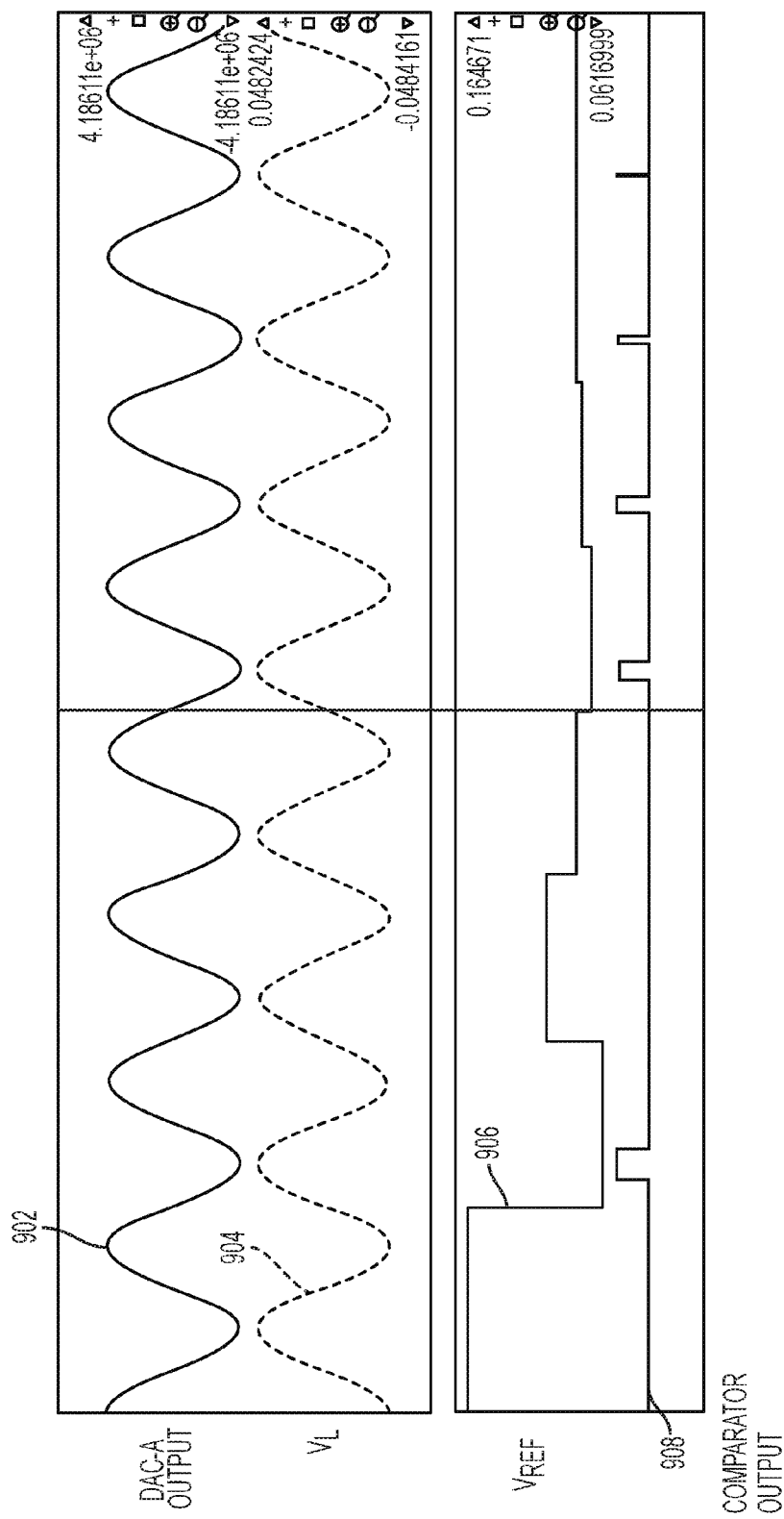
FIG. 9 is an example timing diagram illustrating an alternating current (AC) load characteristic measurement for one frequency according to one embodiment of the disclosure.

A timing diagram illustrating one AC measurement technique as described using a binary search algorithm above is shown in FIG. 9. FIG. 9 is an example timing diagram illustrating an alternating current (AC) load characteristic measurement for one frequency according to one embodiment of the disclosure. In FIG. 9, graph 902 illustrates a sine wave output of DAC-A 312, which is applied to the load 360 being measured. The applied current to the load 360 creates a load voltage $V_L$ shown in graph 904, which is input to amplifier 350. A reference voltage $V_{REF}$, also input to the amplifier 350 for comparison to the load voltage $V_L$, is shown in graph 906. The DAC-B 332 output is controlled to obtain desired reference voltages $V_{REF}$ shown in graph 906. The graph 906 shows the reference voltage $V_{REF}$ changing once per cycle of the graph 904; however, the $V_{REF}$ changes may occur less or more frequently. An output of the amplifier 350 is shown in graph 908. The switches in the amplifier 350 output may be recorded and used to determine a characteristic of the load 360, such as an impedance of the load 360 at the frequency of the sine wave generated by the DAC-A 312.

The methods of FIG. 4, FIG. 5, FIG. 6, FIG. 7, and FIG. 8 may be executed on circuitry such as that illustrated in FIG. 3. In the circuitry of FIG. 3, a comparator offset may exist. For example, without taking into account the offset the comparator 350 may trip when $V_L = V_{REF}$, such that the load 360 can be calculated from the following equation:

$$Z_L = Z_0 = \frac{R_{REF}}{\frac{I_L}{I_{REF}} - 1}$$

When a comparator offset, $V_{OS}$, is taken into account the comparator 350 may trip when $V_L = V_{REF} - V_{OS}$, such that the load 360 can be calculated from the following equation:

$$Z_L = Z_0 \left( \frac{1 - \frac{V_{OS}}{I_{REF} R_{REF}}}{1 + \frac{V_{OS}}{(I_L - I_{REF}) R_{REF}}} \right)$$

With DAC offsets, $I_{OFF1}$ and $I_{OFF2}$ corresponding to DAC-A and DAC-B offsets, taken into account, the load 360 can be calculated from the following equation:

$$Z_L = Z_0 \left( \frac{1 - \left(\frac{V_{OS} - I_{OFF2} R_{REF}}{I_{REF} R_{REF}}\right)}{1 + \left(\frac{V_{OS} + (I_{OFF1} + I_{OFF2}) R_{REF}}{(I_L - I_{REF}) R_{REF}}\right)} \right)$$

If $V_{OS} = I_{OFF2} R_{REF}$, then the numerator of the above equation is equal to zero. This can be accomplished in a circuit by passing the current $I_{OFF2}$ through $R_{REF}$ and comparing it against $V_{OS}$. A circuit topology for performing such a calibration is shown in FIG. 10.

Figure 10:
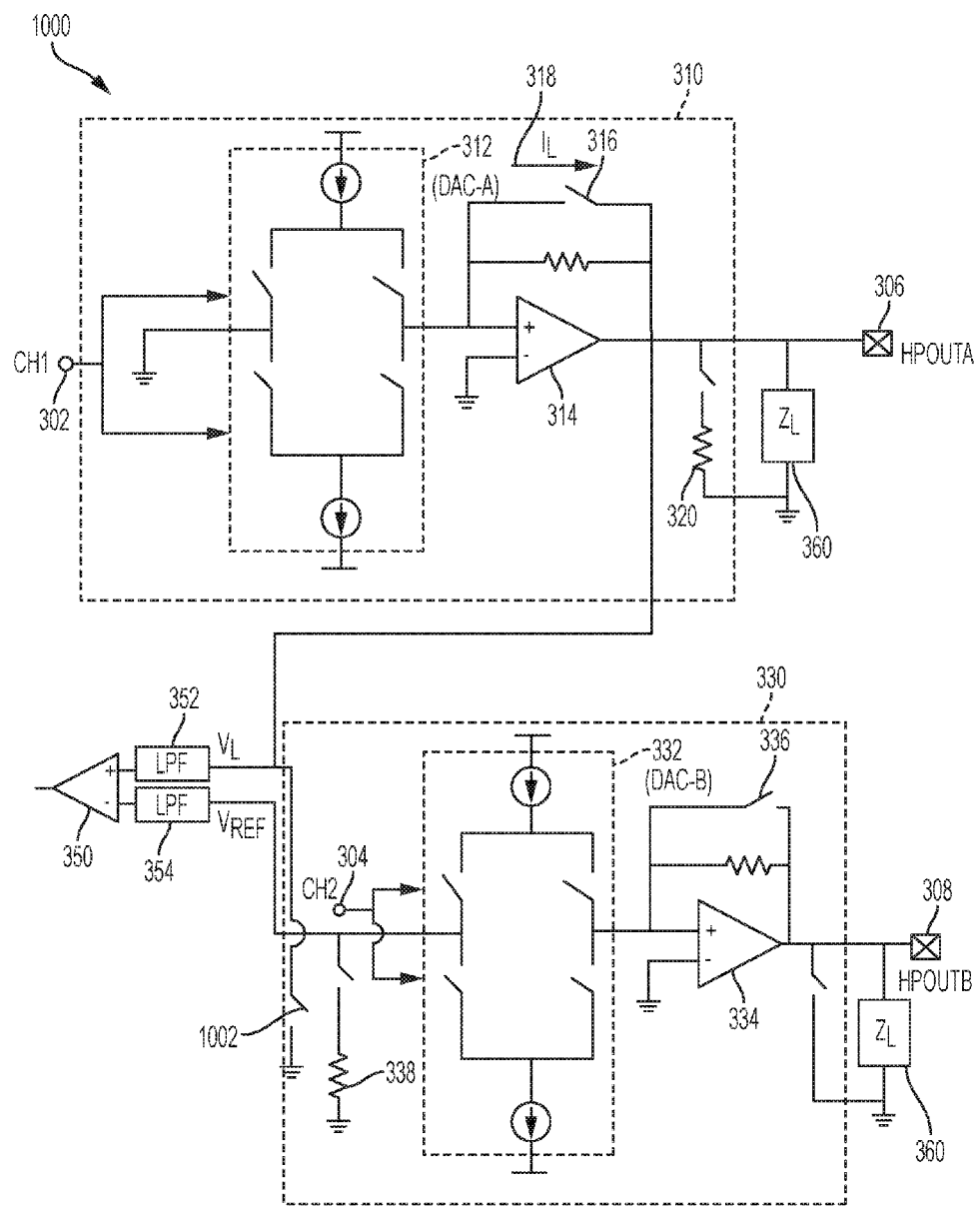
FIG. 10 is an example circuit illustrating a digital-to-analog converter (DAC)-based measurement of load characteristics of headphones with an ability to compensate for comparator offset according to one embodiment of the disclosure.

FIG. 10 is an example circuit illustrating a digital-to-analog converter (DAC)-based measurement of load characteristics of headphones with an ability to compensate for comparator offset according to one embodiment of the disclosure. Circuit 1000 of FIG. 10 is similar to the circuit 300 of FIG. 3 but includes a switch 1002 coupling one input of the amplifier 350 to ground. The switch 1002 may be controlled to cancel the effect of offset in amplifier 350. That is, the switch 1002 may be activated to couple one input of the amplifier 350 to ground to determine a voltage offset of the amplifier 350. Then, that known offset voltage may be compensated for in later measurements, such as measurements of the load voltage $V_L$. One method for calibrating the circuit to determine the offset may include toggling switch 1002 to ground non-inverting input of the amplifier 350 and driving a current from DAC-B 332 through resistance 338. Because the same amplifier 350 is used to measure DAC offset, then $I_{OFF2} = V_{OS2}/R_{REF}$, and then the load 360 may be computed from the following equation:

$$Z_L = Z_0 \left( \frac{1}{1 - \frac{I_{OFF1}}{(I_L - I_{REF})}} \right)$$

Thus, the comparator offset is cancelled and the only remaining offset is $I_{OFF1}$ corresponding to DAC-A, however this can be reduced by a DAC-A offset calibration.

The schematic flow chart diagram of FIG. 4, FIG. 5, FIG. 6, FIG. 7 is generally set forth as a logical flow chart diagram. As such, the depicted order and labeled steps are indicative of aspects of the disclosed method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagram, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

If implemented in firmware and/or software, functions described above may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise random access memory (RAM), read-only memory (ROM), electrically-erasable programmable read-only memory (EEPROM), compact disc read-only memory (CD-ROM) or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and Blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. An apparatus, comprising:
   a first output node configured to couple to a load and output a first portion of a differential signal, wherein the load comprises a transducer for reproducing audio;
   a second output node configured to couple to the load and output a second portion of a differential signal;
   a first current-mode digital-to-analog converter (DAC) coupled to the first output node through a first switch;
   a second current-mode digital-to-analog converter (DAC) coupled to the second output node through a second switch;
   a reference node coupled to the second current-mode digital-to-analog converter (DAC) and coupled to a reference resistance, wherein the reference node is set at a reference voltage by driving a reference current through the second current-mode digital-to-analog converter (DAC) and through the reference resistance;
   a comparator coupled to the first output node and coupled to the reference node; and
   a controller configured:
      to operate the first current-mode digital-to-analog (DAC) and to operate the second current-mode digital-to-analog (DAC) to generate a direct current (DC) signal at the first output node and the reference node, respectively;
      to monitor an output of the comparator to determine a characteristic of the load; and
      to identify the transducer based, at least in part, on the determined characteristic of the load.

2. The apparatus of claim 1, wherein the controller is configured:
   to monitor the output of the comparator to determine a DC impedance of the load.

3. The apparatus of claim 2, wherein the controller is configured to operate the second current-mode digital-to-analog (DAC) to perform a step ramp of the reference voltage at the reference node.

4. The apparatus of claim 2, wherein the controller is configured to operate the second current-mode digital-to-analog (DAC) to perform a binary search for a reference current and corresponding reference voltage at which a voltage across the load is approximately equal to the reference voltage.

5. The apparatus of claim 2, wherein the controller is configured to identify the transducer based, at least in part, on the determined DC impedance of the load.

6. The apparatus of claim 2, wherein the controller is further configured:
   to operate the first current-mode digital-to-analog (DAC) and to operate the second current-mode digital-to-analog (DAC) to generate an alternating current (AC) signal at the first output node and the reference node, respectively; and
   to monitor an output of the comparator to determine an AC frequency response of the load.

7. The apparatus of claim 6, wherein the controller is configured to identify the transducer based, at least in part, on the determined DC impedance of the load and the determined AC frequency response of the load.

8. The apparatus of claim 1, further comprising a controller, wherein the controller is configured:
   to operate the first current-mode digital-to-analog (DAC) to generate an alternating current (AC) signal at the first output node;
   to operate the second current-mode digital-to-analog (DAC) to generate a direct current (DC) signal at the reference node; and
   to monitor an output of the comparator to determine an AC frequency response of the load.

9. The apparatus of claim 8, wherein the controller is configured to identify the transducer based, at least in part, on the determined AC frequency response of the load.

10. The apparatus of claim 8, wherein the controller is configured to operate the second current-mode digital-to-analog (DAC) to repeatedly increase the DC signal at the reference node during a positive slope of the generated alternating current (AC) signal.

11. The apparatus of claim 1, further comprising a switch coupled to the comparator and the first output node, wherein the switch is configured to ground one input of the comparator when the switch is activated to perform calibration of the comparator.

12. The apparatus of claim 1, wherein the first current-mode digital-to-analog converter (DAC) and the second current-mode digital-to-analog converter (DAC) are configured to perform a load characteristic measurement during a first time period and are configured to provide an audio signal output to the first output node and the second output node, respectively, during a second time period.

13. An apparatus, comprising:
   a controller configured to couple to an amplifier circuit and determine at least one characteristic of a load coupled to the amplifier, wherein the load comprises a transducer, and wherein the controller is configured to perform the steps of:
      applying a first current from a first current-mode digital-to-analog converter (DAC) to a load through a switch;
      receiving an indication of a first voltage across the load resulting from the application of the first current;
      applying a second current from a second current-mode digital-to-analog converter (DAC) to a reference load;

receiving an indication of a second voltage across the reference load resulting from the application of the second current;

comparing a first voltage across the load with a second voltage across the reference load;

determining a characteristic of the load; and identifying the transducer based, at least in part, on the determined characteristic of the load.

14. The apparatus of claim 13, wherein the controller is configured to apply a direct current (DC) signal as the first current from the first current-mode digital-to-analog converter (DAC) and to determine a DC impedance of the load.

15. The apparatus of claim 14, wherein the controller is further configured to perform steps comprising adjusting the second current from the second current-mode digital-to-analog converter (DAC) to the reference load, wherein the adjustment comprises a step ramp of the second current-mode digital-to-analog converter (DAC).

16. The apparatus of claim 13, wherein the controller is further configured to perform steps comprising adjusting the second current from the second current-mode digital-to-analog converter (DAC) to the reference load, wherein the adjustment comprises a portion of a binary search for a current level at which the first voltage and the second voltage are approximately equal.

17. The apparatus of claim 13, wherein the controller is configured to determine a DC impedance of a transducer coupled to an audio amplifier and to identify the transducer based, at least in part, on the determined DC impedance of the transducer.

18. The apparatus of claim 13, wherein the controller is further configured to apply an alternating current (AC) signal as the first current from the first current-mode digital-to-analog converter (DAC) and to determine an AC frequency response of the load.

19. The apparatus of claim 18, wherein the controller is configured to identify the transducer based, at least in part, on the determined DC impedance of the load and the determined AC frequency response of the load.

20. The apparatus of claim 13, wherein the controller is configured to apply an alternating current (AC) signal as the first current from the first current-mode digital-to-analog converter (DAC) and to determine an AC frequency response of the load.

21. The apparatus of claim 20, wherein the controller is configured to identify the transducer based, at least in part, on the determined AC frequency response of the load.

22. The apparatus of claim 21, wherein the controller is configured to operate the second current-mode digital-to-analog (DAC) to repeatedly increase the DC signal at the reference node during a positive slope of the generated alternating current (AC) signal.

23. The apparatus of claim 13, wherein the controller is configured to ground one input of a comparator configured to calibrate the comparator that performs the step of comparing a first voltage across the load with a second voltage across the reference load.

24. A method, comprising:

applying a first current from a first current-mode digital-to-analog converter (DAC) to a load, wherein the load comprises a transducer for reproducing audio, through a switch;

receiving an indication of a first voltage across the load resulting from the application of the first current;

applying a second current from a second current-mode digital-to-analog converter (DAC) to a reference load;

receiving an indication of a second voltage across the reference load resulting from the application of the second current;

comparing the first voltage across the load with the second voltage across the reference load;

determining a characteristic of the load from the comparison of the first voltage and the second voltage; and identifying the transducer based, at least in part, on the determined characteristic of the load.

25. The method of claim 24, wherein the step of applying the first current comprises applying a direct current (DC) signal, and wherein the method further comprises a step of determining a DC impedance of the load based on the step of comparing the first voltage with the second voltage.

26. The method of claim 25, further comprising adjusting the second current from the second current-mode digital-to-analog converter (DAC) to the reference load, wherein the adjustment comprises a step ramp of the second current-mode digital-to-analog converter (DAC).

27. The method of claim 24, further comprising adjusting the second current from the second current-mode digital-to-analog converter (DAC) to the reference load, wherein the adjustment comprises a portion of a binary search for a current level at which the first voltage and the second voltage are approximately equal.

28. The method of claim 25, further comprising:

determining a DC impedance of a transducer coupled to an audio amplifier; and identifying the transducer based, at least in part, on the determined DC impedance of the transducer.

29. The method of claim 25, further comprising:

applying a third current comprising alternating current (AC) from the first current-mode digital-to-analog converter (DAC); and determining an AC frequency response of the load.

30. The method of claim 29, wherein the method further comprises identifying the transducer based, at least in part, on the determined DC impedance of the load and the determined AC frequency response of the load.

31. The method of claim 24, wherein the step of applying the first current comprises applying an alternating current (AC) signal, and wherein the method further comprises a step of determining an AC frequency response of the load based on the step of comparing the first voltage with the second voltage.

32. The method of claim 31, wherein the method further comprises identifying the transducer based, at least in part, on the determined AC frequency response of the load.

33. The method of claim 31, further comprising operating the second current-mode digital-to-analog (DAC) to repeatedly increase the DC signal at the reference node during a positive slope of the generated alternating current (AC) signal.

34. The method of claim 24, further comprising grounding one input of a comparator configured to perform the step of comparing a first voltage across the load with a second voltage across the reference load, wherein a comparator offset is determined by performing the step of grounding the one input of the comparator.

* * * * *